United States Patent [19]

Lien et al.

[11] 4,370,798
[45] Feb. 1, 1983

[54] INTERLEVEL INSULATOR FOR INTEGRATED CIRCUIT WITH IMPLANTED RESISTOR ELEMENT IN SECOND-LEVEL POLYCRYSTALLINE SILICON

[75] Inventors: Jih-Chang Lien, Sugarland; Te-Long Chiu, Houston, both of Tex.

[73] Assignee: Texas Instruments Incorporated, Dallas, Tex.

[21] Appl. No.: 284,846

[22] Filed: Jul. 20, 1981

Related U.S. Application Data

[62] Division of Ser. No. 48,961, Jun. 15, 1979, Pat. No. 4,291,328.

[51] Int. Cl.$^3$ .................. H01L 29/04; H01L 29/78
[52] U.S. Cl. ................... 29/576 B; 29/571; 29/591; 148/1.5; 148/187; 357/54; 357/59; 357/91
[58] Field of Search ............... 148/1.5, 187; 29/576 B, 29/571, 591; 357/54, 59, 91

[56] References Cited

U.S. PATENT DOCUMENTS

| 4,110,776 | 8/1978 | Rao et al. | 357/51 |
| 4,209,716 | 6/1980 | Raymond, Jr. | 357/59 |
| 4,240,097 | 12/1980 | Raymond, Jr. | 357/59 |
| 4,246,692 | 1/1981 | Rao | 29/571 |
| 4,285,001 | 8/1981 | Gerzberg et al. | 357/59 |
| 4,291,328 | 9/1981 | Lien et al. | 357/59 |
| 4,297,721 | 10/1981 | McKenny et al. | 357/59 |

Primary Examiner—Upendra Roy
Attorney, Agent, or Firm—John G. Graham

[57] ABSTRACT

Integrated circuit resistor elements ideally suited for load devices in static MOS RAM cells are made in second-level polycrystalline silicon by an ion implant step compatible with a self-aligned N-channel silicon-gate process. The second-level polysilicon is insulated from first-level polysilicon by multi-layer insulation; first, a thermal oxide layer provides better edge breakdown characteristics for transistors, then secondly a layer of doped deposited oxide provides improved step coverage, and finally an undoped deposited oxide is used to prevent out diffusion from doped oxide to second level polysilicon which would change the characteristics of the resistors.

6 Claims, 12 Drawing Figures

INTERLEVEL INSULATOR FOR INTEGRATED CIRCUIT WITH IMPLANTED RESISTOR ELEMENT IN SECOND-LEVEL POLYCRYSTALLINE SILICON

This is a division of application Ser. No. 048,961, filed June 15, 1979, now U.S. Pat. No. 4,291,328.

BACKGROUND OF THE INVENTION

This invention is directed to methods of making semiconductor devices, and more particularly to multilevel insulation between polysilicon layers in MOS integrated circuits.

In early semiconductor integrated circuits, resistors were provided by diffused regions or by portions of the semiconductor substrate which were defined by etching, as seen in U.S. Pat. No. 3,138,743 issued to Jack S. Kilby and assigned to Texas Instruments . As the density of components in integrated circuits grew, the area occupied by resistors became prohibitive, so logic forms were favored which used few resistors or no resistors. For example, "TTL" or transistor-transistor logic and $I^2L$ or integrated injection logic in bipolar technology had features minimizing the area on a bar dedicated to resistors. In MOS logic and memories, transistors are used as load devices or in effect as resistors. Examples of every complex MOS ciruits containing many thousands of transistors but no resistors in a single chip digital processor or memory are shown in U.S. Pat. No. 3,940,747, issued to Kuo and Kitagawa and U.S. Pat. No. 3,998,604, issued to J. H. Raymond, Jr., both assigned to Texas Instruments.

High density MOS memory devices such as the 4096 bit memory described in U.S. Pat. No. 3,940,747, or the "16K" or 16,384 bit memory described in U.S. Pat. No. 4,050,061, assigned to Texas Instruments, have been of the dynamic type because dynamic one-transistor cells are the smallest in area.

In some parts of digital equipment, however, the referesh circuitry required for dynamic memories is incompatible or undesirable, so static memory is preferred. Static cells traditionally employ six-transistor bistable circuits wherein depletion-load MOS transistors are used as load devices. These cells are much larger than the one-transistor cells of dynamic memory devices, so the density is less. Also, power dissipation is high due to the requirement that some current must flow through one side of each cell in the array to maintain the stored data.

In U.S. Pat. No. 4,246,692 by G. R. Mohan Rao, assigned to Texas Instruments, there is disclosed a resistor element particularly for a static RAM cell wherein the resistors are implanted regions buried beneath field oxide. In application Ser. No. 727,116, filed Sept. 27, 1976 by Rao, Stanczak, Lien and Bhatia, now U.S. Pat. No. 4,110,776 assigned to Texas Instruments, a static cell using implanted resitors in polycrystalline silicon over field oxide is described. While these inventions represent marked improvements, further reduction in cell size is needed for arrays of the 16K or larger size.

It is a principle object of this invention to provide an improved method of making resistor elements in integrated circuits. Another object is to provide a method of making an improved small area static RAM cell for MOS memory devices of high density. An additional object is to provide small area, high resistance load elements for transistors in semiconductor integrated circuits.

SUMMARY OF THE INVENTION

In accordance with the invention, resistor elements for load devices in static MOS RAM cells are made in second-level polycrystalline silicon by an ion implant step compatible with a self-aligned N-channel silicon-gate process. The second-level polysilicon is insulated from first-level polysilicon by multi-layer insulation; first, a thermal oxide layer provides better edge breakdown characteristics for transistors, then secondly a layer of doped deposited oxide provides improved step coverage, and finally an undoped deposited oxide is used to prevent out diffusion from doped oxide to second level polysilicon which would change the characteristics of the resistors.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
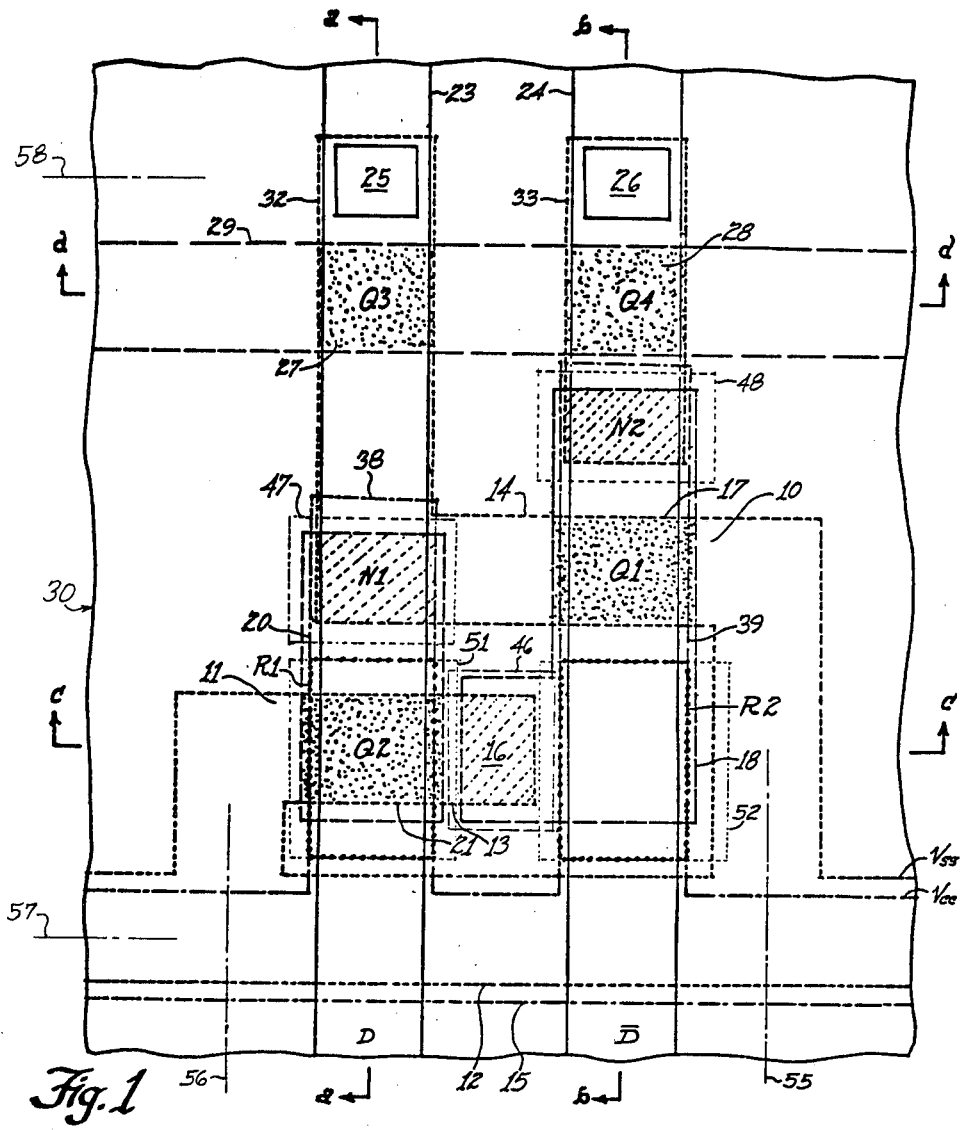
FIG. 1 is a greatly enlarged plan view of a small portion of a semiconductor chip showing the physical layout of a static RAM cell using the features of the invention.

Referring to FIG. 1, a physical layout is shown of an N-channel silicon gate MOS static RAM cell which utilizes the features of the invention. This cell is of course greatly enlarged in FIG. 1, as it would actually occupy only about 1.5 to 2.0 square mils, i.e., the larger dimension of the cell of FIG. 1 would be less than about two mils. The cell is also shown in FIG. 2 as an electrical schematic diagram, with the parts numbered the same as FIG. 1.

Figure 2:
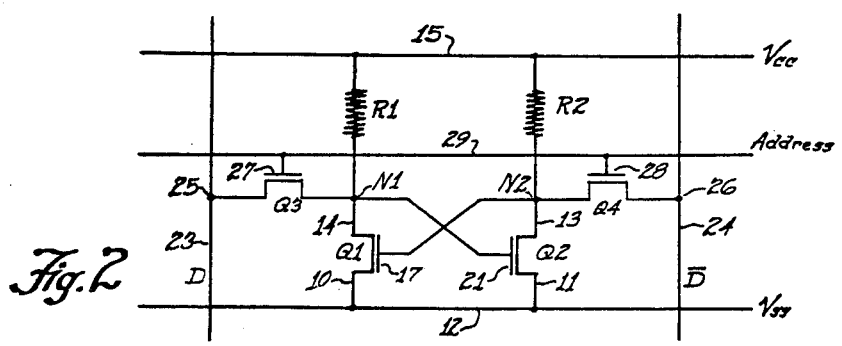
FIG. 2 is an electrical schematic diagram of the cell of FIG. 1.

The cell of FIGS. 1 and 2 consists of a pair of cross-coupled driver transistors Q1 and Q2, each of which has a source 10 or 11 in the form of an N+ region connected to an elongated N+ diffused strip which is a ground or Vss line 12. Each transistor has an N+ drain region 13 or 14 which is electrically connected via nodes N1 and N2 to a Vcc or positive supply line 15 through a resistor R1 or R2. The resistors R1 and R2 are formed by ion implantation in a second-level polycrystalline silicon layer according to a feature of this embodiment of the invention. The Vcc supply line 15 is an elongated heavily doped region of the second-level poly. A node or contact area 16 at the drain 13 of the transistor Q2 is connected to a first level polysilicon strip which forms the gate 17 of the transistor Q1 and the node N2 in one polysilicon conductor 18. In like manner a first-level polysilicon conductor 20 connects the poly gate 21 of the transistor Q2 of the node N1 at the drain 14 of the Q1, providing the cross-coupling connection of a bistable or flip-flop circuit. Metal strips which provide data lines 23 and 24 (usually referred to D and $\overline{D}$, or as D0 and D1) are connected to the nodes N1 and N2 via coupling transistors Q3 and Q4 and metal-to moat contacts 25 and 26 which include a second-level poly layer according to a feature of one embodiment. The gates 27 and 28 of the transistors Q3 and Q4 are connected to (actually part of) a word address line 29 which is a first-level polysilicon strip.

Referring to FIGS. 3a-3d, sectional views of the cell of FIG. 1 show the details of construction. The cell is a small part of a substrate 30 of P-type silicon. The transistors Q1, Q2, Q3 and Q4 are formed in elongated moat regions in which N+ diffused regions 10, 11, 12, 13 and 14 create the Vss line and source and drain regions for the transistors. Also, N+ regions 32 and 33 in the moats form the lower part of the metal-to-moat contacts 25 and 26. A thin silicon gate dielectric layer 34 and phosphorus-doped first-level polysilicon areas 17, 18, 20, 27, 28 and 29 form the gates of the transistors, the interconnects, and the address line. The polysilicon strips which form the gates 17 and 21 are parts of the elongated strips which include the cross-coupling interconnects. Thick field oxide 35 exists at all areas where moats including N+ diffused regions or transistors do not exist, and a P+ boron-doped channel-stop region 36 is created under all areas of the field oxide 35. An insulating layer 37 is formed over the entire top surface, overlying the polysilicon, the field oxide 39, and the N+ regions. The lines 23 and 24 are metal strips overlying this insulating layer 37.

Figure 3A:
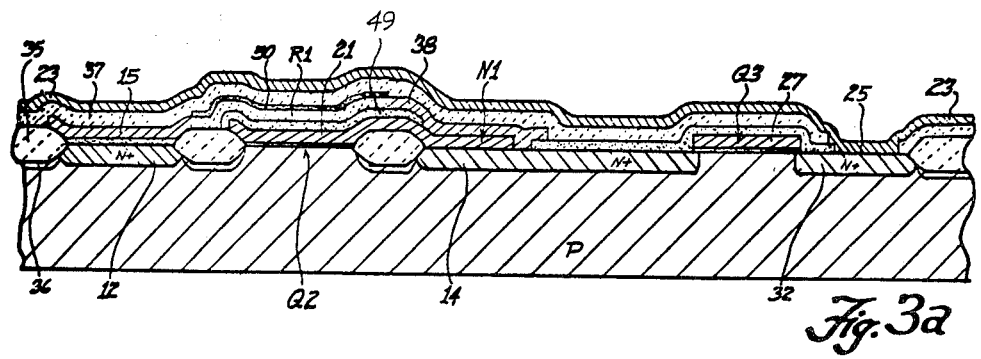
FIG. 3a–3d are elevation views in section of the cell of FIG. 1, taken along the lines a—a, b—b, c—c and d—d, respectively.
Figure 3B:
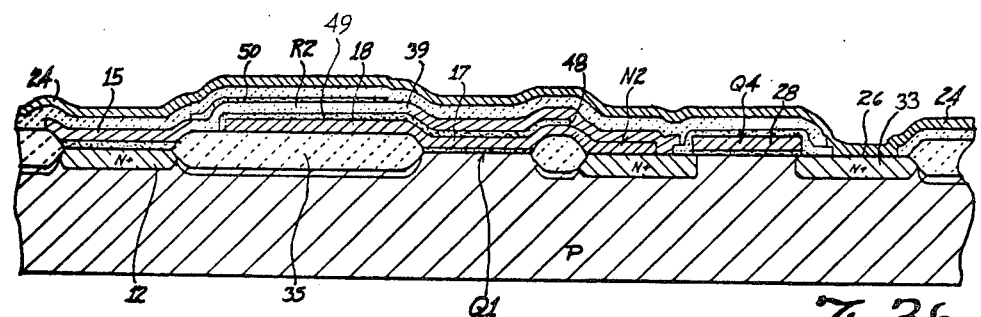
Figure 3C:
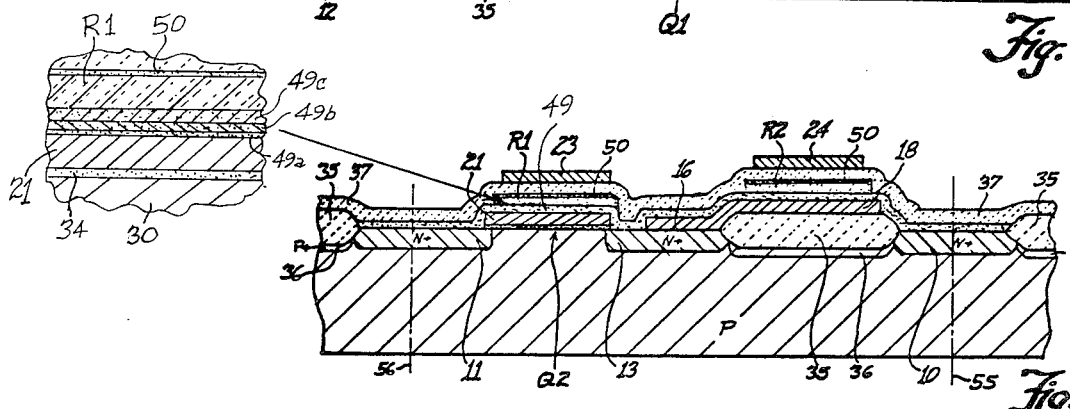
Figure 3D:
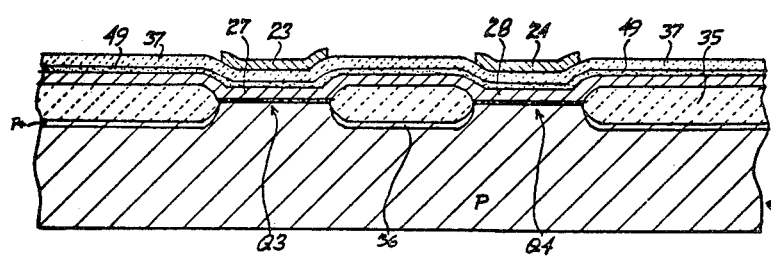

As seen in FIGS. 3a, 3b and 3c, the resistors R1 and R2, according to a primary feature of the invention, consist of phosphorus ion implanted portions of second-level polycrystalline silicon strips 38 and 39 which extend from the Vcc line 15. The remainder of the strips 38 and 39 as well as the line 15, except for the resistors R1 and R2, is heavily doped with phosphorus so that it will be highly conductive. The size of the resistor R1 or R2 is about 0.15 mil × 0.3 mil in area as seen in plan view of FIG. 1, and about 5,000Å or 0.5 micron in thickness as seen in a section view as FIGS. 3a—3c. The resistor is seen to overlay the first level poly line 20, and indeed overlies the gate 21 of the transistor Q1. This results in a saving in space on the chip which is quite significant. Also, the second level poly in which the resistors are formed does not form the gates of transistors, so it is less critical. The use of second-level poly further allows the Vcc line to overlay the Vss line, which conserves additional space. The cell of FIGS. 1-3 is potentially about one-third the size of the static cell using implanted resistors in single level poly as disclosed in application Ser. No. 727,116, now U.S. Pat. No. 4,110,776.

An important feature of the invention is the triple level insulator 49 which insulates the first level polysilicon from the second level polysilicon. This insulator includes a lower level 49a which is thermal oxide of about 500Å functioning as a thermal refill for better transistor edge breakdown. A second level insulator 49b is a doped chemical-vapor deposited (CVD) oxide of about 1500 Å which provides better step coverage; after densification, it will smooth out the step of the first level polysilicon and also it will prevent micro-cracking of oxide around the edges of the first level polysilicon. Third, a layer 49c of undoped CVD oxide of about 2000Å prevents phosphorus doping of the second level polysilicon from the doped layer 49b during subsequent heat cycles; out diffusion from the layer 49b would lower the resistance of the lightly-doped material of the resistors R1 and R2.

The magnitude of each of the resistors R1 and R2 is about 500K ohm or more; a large value for these resistors functions to reduce power consumption in a larger array of static cells. Each cell will have one transistor on and one off, storing a "1" or "0," and the on transistor will have a high resistance in series with it to minimize power drain while the resistance in series with the off transistor will provide an adequate voltage on the gate of the opposite transistor and almost a full logic level (minus a Vt drop for Q3 or Q4) to the output lines 23 or 24 if the cell is addressed. The node N1 or N2 which is to be a "1" will charge to almost Vcc through the series resistance. Current dissipation, assuming the resistors R1 and R2 are 1 megohm, is 1 microamp per cell, or 16 milliamp for a 16K array; power dissipation would be 80 milliwatts. Resistors R1 and R2 can be increased to values exceeding 20 megohm.

Figure 4A:
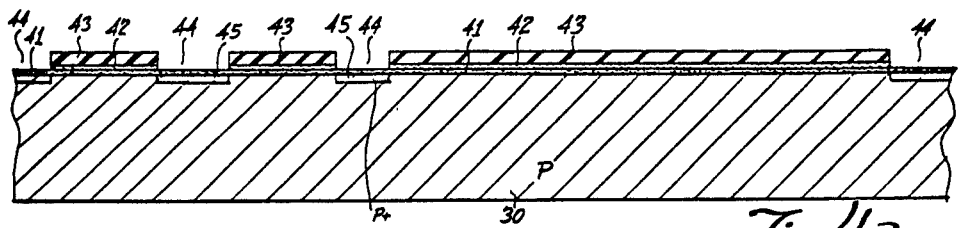
FIGS. 4a–4e are elevation views in section of the semiconductor device of FIGS. 1 and 3a, at successive states in the manufacturing process, taken along the line a—a in FIG. 1.

Referring now to FIGS. 4a-4e, a process for making the N-channel, silicon-gate, self-aligned, double-level poly, MOS integrated circuit device of FIGS. 1 and 3a-3d will be described. The starting material is a slice of P-type monocrystalline silicon, perhaps 3 inches in diameter and 20 mils thick, cut on the <100> plane, of a resistivity of about 6 to 8 ohm-cm. In FIGS. 3a or 4a, a wafer or body 30 represents a very small part of the slice, of about 1.5 mil in lateral dimension, chosen as a representative sample cross section. First, after appropriate cleaning, the slice is oxidized by exposing to oxygen in a furnace at an elevated temperature of perhaps 1000 degrees C. to produce an oxide layer 41 of a thickness of about 1000Å. Next a layer 42 of silicon nitride $Si_3N_4$ about 1000Å thick is formed by exposing to an atmosphere of silane and ammonia in an rf reactor. A coating 43 of photoresist is applied to the entire top surface, then exposed to ultraviolet light through a mask which defines the desired pattern, and developed, leaving areas 44 where nitride is to be etched away and field oxide 35 is to be grown. Alternatively, smaller geometries and thus smaller cell sizes may be obtained by using electron beam lithography in place of UV light and glass masks to expose the photoresist, as disclosed in Bell Laboratories Record, March 1976, p. 69–72 and Electronic Products, February 1977, p. 17. The slice is subjected to a plasma etch, which removes the part of the nitride layer 42 not covered by the exposed photoresist 43, but does not remove the oxide layer 41 and does not react with the photoresist 43.

The slice is next subjected to an ion implant step, whereby boron atoms are implanted in the areas 44 of silicon not covered by photoresist 43 and nitride 42. The photoresist is left in place as an implant mask. Boron is an impurity which produces P-type conductivity, so more heavily doped P+ regions 45 will be produced in the surface. The oxide layer 41 is left in place during the implant because it prevents the implanted boron atoms from out-diffusing from the surface during subsequent heat treatment. The boron implant is at a dosage of about $4 \times 10^{12}/cm^2$ at 100 KeV. After the implant, the photoresist layer 43 is removed.

As well be seen, the regions 45 do not exist in the same form in the finished device, because some of this part of the slice will have been consumed in the oxidation procedure. The implanted regions 45 will ultimately produce the P+ channel stop regions 36.

As set forth in U.S. Pat. No. 4,055,444 issued to G. R. Mohan Rao, assigned to Texas Instruments, the next step in the process is to subject the slice to a heat treatment of annealling step, during which the slice is maintained at a temperature of about 1000 degrees C for about 2 hours in an inert atmosphere, preferably nitrogen. This step causes the boron concentration to change markedly, which has desirable effects aside from reduction in bulk damage in the crystal structure. The P+ regions 45 penetrate deeper into the silicon surface during this anneal step.

Figure 4B:
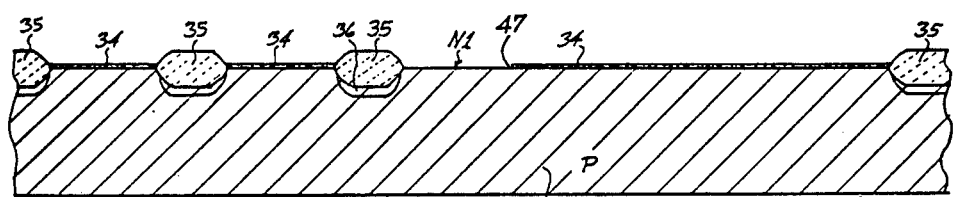

The following step is formation of field oxide, which is done by subjecting the slices to steam or an oxidizing atmosphere at about 950 degrees C for perhaps 10 hours. As seen in FIG. 4b, this causes a thick field oxide region or layer 35 to be grown, and this regions extends into the silicon surface because silicon is consumed as it oxidizes. The nitride layer 42 masks oxidation beneath it. The thickness of this layer 35 is about 8000 to 10,000Å, half of which is above the original surface and half below. The boron doped P+ region 45 as previously implanted and modified by the anneal step will be partly consumed, but will also diffuse further into the silicon ahead of the oxidation front. Thus, the P+ regions 36 will result which will be deeper and of more uniform and acceptable concentration at the surface compared to what would have resulted without the anneal step. Also, the regions 36 will not have the extent of crystalline structure damage characteristic of implanted devices.

The nitride layer 42 and its underlying oxide layer 41 are removed by ethcing, as the next step, and another thin silicon oxide layer 34 of about 800Å is grown over the exposed areas of silicon.

At this time, although not reflected in the FIGURES, two ion implant steps can be performed to create the desired threshold or operating parameters in transistors in the integrated circuit. First, boron is implanted in all moat areas at 50 KeV to a dosage of about $2.5 \times 10^{11}$ atoms per cm$^2$ for the purpose of adjusting the threshold voltage of thin oxide enhancement mode transistors so that substrate bias voltage will not be needed. Then, a photoresist layer is applied and patterned to expose the channel areas of depletion load transistors in peripheral circuitry, not in the cell array. These areas are then subjected to a phosphorus implant at 150 KeV with a dosage of about $1 \times 10^{12}$ per cm$^2$. This phosphorus implant is selected to produce high speed devices in the peripheral circuits. As explained in application Ser. No. 727,116, if depletion load transistors had been used in place of the resistors R1 and R2 in the cell array then attaining low standby power dissipation would have been the most important factor rather than speed in the peripheral circuits and so speed in terms of access time would have been comprised. In addition, of course, the use of resistors R1 and R2 in second-level poly reduces the cell size.

Figure 4C:
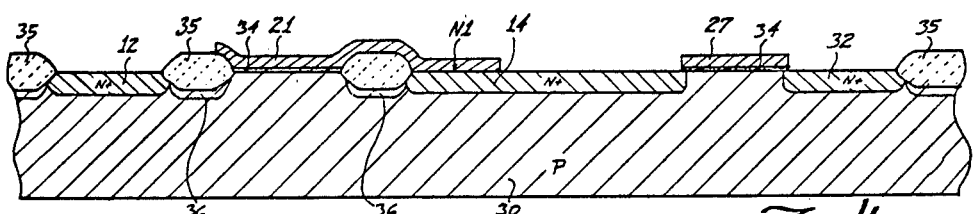

Windows 46, 47 and 48 (see FIG. 1 and FIG. 4b) for first level polysilicon to moat contacts are patterned and etched using photoresist removing the gate oxide layer 34 in selected areas such as the contact areas at the nodes N1 and N2. Next, a layer of polycrystalline silicon is deposited over the entire slice in a reactor using standard techniques, for example, by decomposition of silane in hydrogen at an elevated temperature to a thickness of 0.4 to 0.6 micron, producing the first-level polysilicon, which is then patterned using photoresist to level form the strips 18 and 20 and the line 29. The resulting structure is seen in FIG. 4c. At the same time using the photoresist which patterns the first level poly, the thin oxides 34 is removed in all exposed areas, leaving oxide only in the transistor gate areas (plus capacitor areas, not shown, which may be needed in peripheral circuitry, as in boot-strap circuits).

Using the remaining first level polysilicon coating and thin oxide 34, as well as the field oxide, as a mask, the slice is now subjected to an N+ ion implant step. Arsenic is implanted and then driven into the silicon slice 30 to produce all of the N+ regions 11, 12, 13, 14, 32, 33, etc. The depth of these regions after driven in is about 6000 to 8000Å. The N+ regions function as conductors which connect the various regions together, and also function as the source or drain regions of all the transistors. This implant renders highly conductive all of the exposed polysilicon areas such gates 17 and 21, the strips 18 and 20, the line 29, etc. In the poly-to-moat contact areas N1 and N2, the N+ implant and drive in penetrates the poly and converts the underlying P-type silicon to N+ because here the oxide layer 34 has been removed. The masks used to define these contact areas when the oxide coating 34 was removed are shown in FIG. 1 as dotted lines 47 and 48. These are much larger than the actual contact areas to allow substantial misalignment.

According to the primary feature of the invention, a triple layer insulating coating 49 is next produced to isolate the first and second level polysilicon layers. After the source drain arsenic implantation and 900° C. nitrogen anneal for 100 minutes, then 1000° C. drive-in for proper junction depth, the first level 49a of the insulating coating 49 is formed by thermal oxide grown over the first level poly by oxidation in dry O$_2$ at high temperature to produce a layer 49a of about 500° C. thickness. Then, low temperature phosphorus doped oxide is deposited in a CVD reactor to a thickness of about 1500 Å, producing a coating 49b. The layer 49b is densified at 1000° C. in nitrogen for 15 min. to smooth out the steps in first level poly. Next, the layer 49c is deposited to a thickness of 2000 Å in a CVD reactor. This layer is undoped. The exposed silicon in the moat areas is oxidized so the coating 49 extends over the N+ regions 10, 11, 12, 13, 14, 32, 33, etc. The first level polysilicon is not consumed unnecessarily by thermal oxidation, yet the integrity of thermal oxide is obtained and smooth transistions result, while the resistors are protected from out diffusion. The thin oxide area of the chip is held to a minimum; the total thin oxide area is one of the primary factors influencing yield.

Figure 4D:
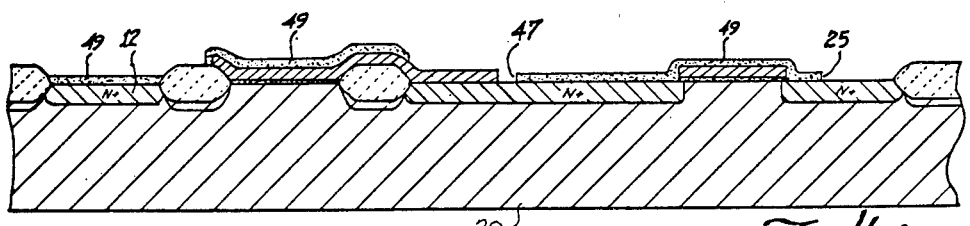

As seen in FIG. 4d, the oxide layer 49 is patterned using photoresist to open the contact areas 25 and 26 and the contact areas 47 and 48 at the nodes N1 and N2, that is, all second-poly to first-poly or second-poly-to-moat contact areas.

The second level of polycrystalline silicon is now deposited using a method as for the first level, providing a thickness of about 0.5 micron.

The entire second-level polycrystalline silicon coating is next subjected to a phosphorus implantation which creates the characteristics of the resistors R1 and R2. Areas of polysilicon which are to be highly conductive will be later subjected to a phosphorus diffusion to leave them heavily doped. To define the resistor characteristics, this implant step is performed at 100 to 150 KeV to a dosage of from $5 \times 10^{13}$ to $1 \times 10^{14}$ phosphorus atoms per cm$^2$, depending upon the desired sheet resistivity for the resistors.

As reported by Bean et al. Journal of Applied Physics, Vol. 40, No. 5, pp. 2358-2359, April 1969, the resistivity of polycrystalline silicon is $5\times 10^5$ ohm-cm with an apparent P-type concentration of $2.1\times 10^{11}$ to $5.8\times 10^{11}$cm$^3$, and a mobility of 33 to 430 cm$^2$/volt-sec. In polysilicon, as the thickness is decreased to less than one micron, the conduction will be along grain boundaries, so resistivity in such case will be at least as high as $10^5$ ohm-cm. The sheet resistance will be $Rs \times 1/d$ or $10^5 \times 1/(0.5 \times 10^{-4})$, which is approximately $2\times 10^9$ ohm per square. This would be too unstable with temperature and too highly resistive. The phosphorus implant serves to produce a resistivity of ideally about one to five megohms per square at 25 degrees C. Lower resistivity results in too large cell size, and higher results in instability, non-reproducibility and excessive voltage dependence.

Figure 4E:
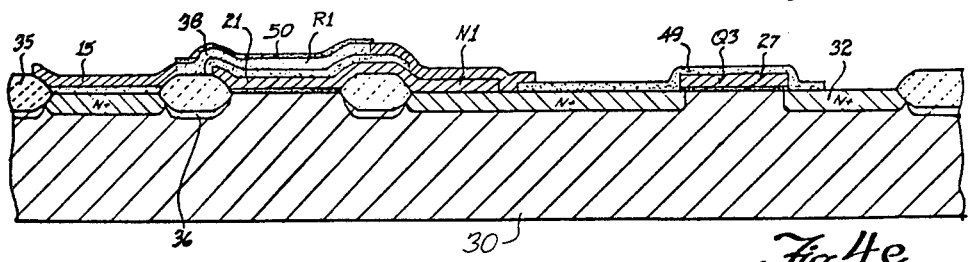

The second level polysilicon coating is next patterned. This is done by applying a layer of photoresist, exposing to ultraviolet light through a mask prepared for this purpose, developing, then etching with the remaining photoresist masking certain areas of the polysilicon. The resulting structure is seen in FIG. 4e, where a part of the remaining polysilicon layer provides what will be the Vcc line 15 and the extensions 38 and 39 thereof which will have the resistors R1 and R2 and the contacts at the nodes N1 and N2. In contrast to the prior application Ser. No. 727,116, no transistor gates are created by this layer of polycrystalline silicon, and indeed it overlies transistor gates.

After patterning the second level polysilicon a protective cap of silicon dioxide is grown on the polysilicon, producing a coating 50 on all exposed surfaces of the poly, including tops and sides. The coating 50 is grown at about 900 degrees C in steam for about two hours, producing approximately 2500Å thickness and consuming part of the polysilicon. The function of the cap is to prevent deposition of impurities on the resistors or diffusion into the resistors. A photoresist masking and etching operation is then used to remove the coating 50 on areas of polysilicon which are to be N+ diffused; it is left in place over the resistors R1 and R2. The masks used to define the oxide left to protect the resistor are seen in FIG. 1 define by dotted lines 51 and 52; these are much wider than the resistors, functioning to permit rather wide margin for error in mask alignment. The masked second-level poly is then subjected to a phosphorus deposition and diffusion, rendering the areas not covered by the oxide 50 highly conductive.

As seen in FIG 3a, fabrication of the device is continued by depositing a thick layer 37 of phosphorus-doped oxide. Rather than by oxidizing, this is done by a low temperature reaction process using conventional chemical vapor deposition techniques. A layer 37 of about 10,000Å is produced, covering the entire slice. This deposition is followed by a "densification" step wherein the slice is heated at 1000 degrees C for the purpose of eliminating minute holes or pores in the oxide. Subsequently, a photoresist operation opens windows in the oxide layer 37 in areas 25 and 26 where metal-to-moat contact is to be made. A thin coating of polysilicon is applied to the slice at this point by plasma deposition; a coating of about 500Å is applied for the purpose of avoiding spiking as can occur when aluminum contacts are applied over thin silicon regions. Spikes of an aluminum-silicon compound can extend through the regions 32 and 33 and short the PN junction. The thin coating of deposited plasma poly provides a source of silicon to be used in formation of aluminum silicide under the contacts, so the silicon of the regions 32 and 33 is not used. Although not shown in the FIGURES, openings can be made in the thick oxide 37 where metal to first poly contacts are needed, as in peripheral circuits, though not in the array. Then, a layer of aluminum is deposited on the entire slice, and selectively etched using photoresist masking to produce the desired pattern of metal strips 23 and 24.

Figure 5:
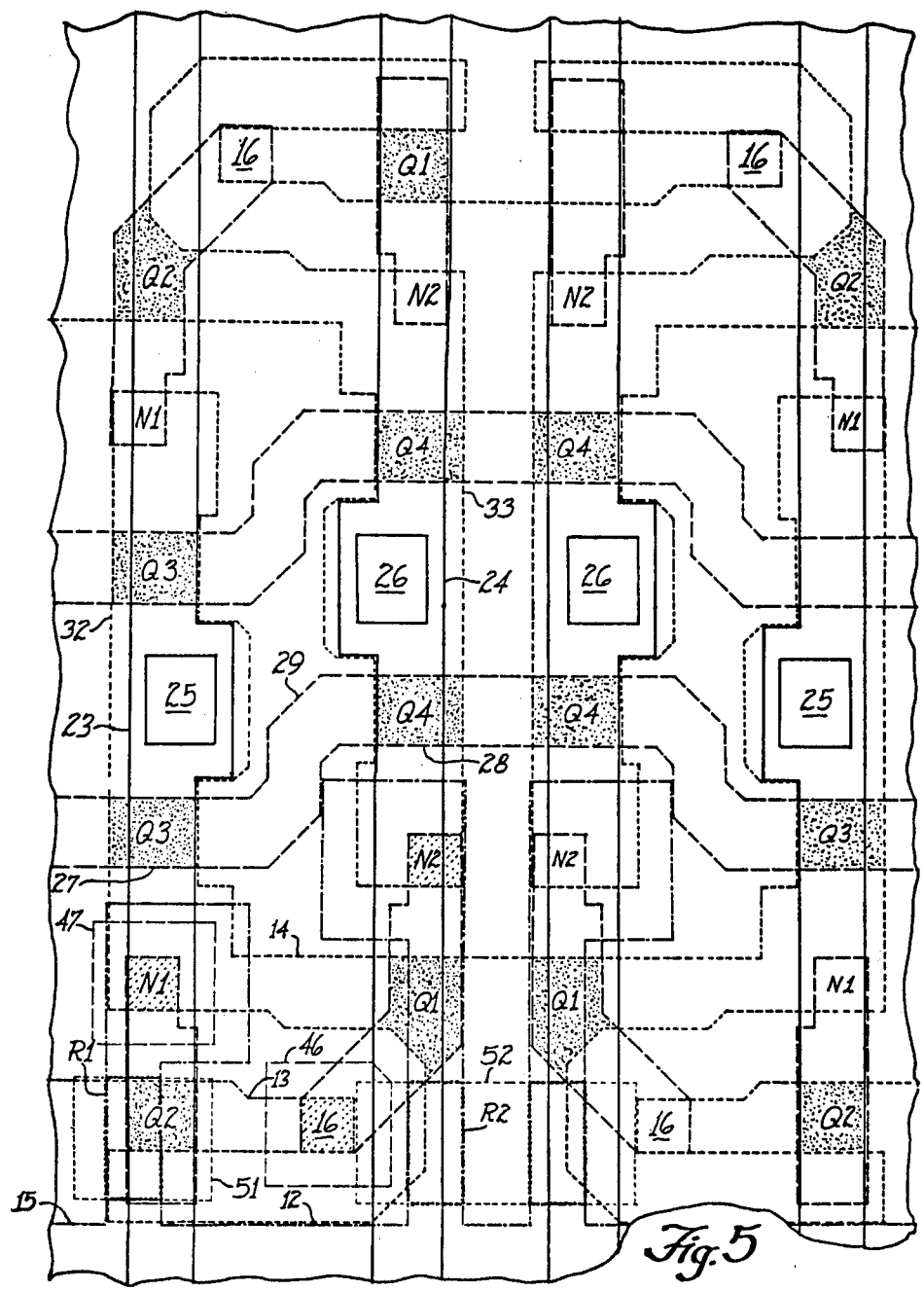
FIG. 5 is a plan view of a layout of the cell of FIG. 1 in an array.

In an array of a large number of the cells of FIG. 1, the layout on the chip would make use of considerable economy of space by mirroring the cell about an axis 55 to define the cell on the right of the one shown, and mirroring the cell about the axis 56 to define the cell on the left. The cell is mirrored about an axis 57 to define the cell below it. So, adjacent cells share the Vcc line 15 and the Vss line 12, as well as the mask holes 51 and 52 and edges of the moat areas 10 and 11. The contacts 25 and 26 are staggered and the cell reversed and mirrored about an axis 58, producing the layout of FIG. 5 in an array, so the contact 25 and 26 are shared with the adjacent cell above the axis 58 of FIG. 1. The moats form complex continuous figures shared by entire columns of cells, rather than discrete moat areas. An array of $2^{14}$ or 16,384 cells would contain 128 rows and 128 columns of cells, but would require only sixty-four of the N+ diffused moat Vss lines 12 and sixty-four poly Vcc lines 15. 8192 sets of the contacts 25 and 26 would be needed, as they are shared.

What is claimed is:

1. A method of making resistor elements in semiconductor integrated circuits, comprising the steps of:
   (a) depositing a first level of polycrystalline silicon over the face of a semiconductor body and patterning it to define electrodes of circuit elements on said face and interconnections between electrodes,
   (b) forming a triple-level insulator over said first level of polycrystalline silicon, the first level insulator being thermally grown silicon oxide on said first level of polycrystalline silicon, the second level insulator being doped low-temperature deposited silicon oxide densified for smooth step transistors, the third level insulator being undoped low-temperature deposited silicon oxide which acts as a diffusion barrier between the second level insulator and lightly doped resistors in second level polycrystalline silicon,
   (c) depositing a second level of polycrystalline silicon on said face and patterning it, the second level partially overlying the first level and overlying some of the circuit elements,
   (d) implanting conductivity-determining impurity material into the second level of polycrystalline silicon to provide resistor regions,
   (e) introducing conductivity-determining impurity material into selected areas of the second level of polycrystalline silicon to provide connections.

2. A method according to claim 1 wherein the first level of polycrystalline silicon forms gates of MOS transistors.

3. A method according to claim 2 wherein the thickness of the first level insulator is much less than that of the second and third level insulators.

4. A method according to claim 2 wherein the step of introducing impurity material includes phosphorus diffusion.

5. A method according to claim 1 wherein a thin silicon oxide coating is applied over the resistor regions of the polycrystalline silicon after implanting impurity material.

6. A method according to claim 5 wherein the coating over the polycrystalline silicon functions to mask the introduction of impurity material.

* * * * *